(12) United States Patent
Loong (10) Patent No.: US 9,756,740 B2
(45) Date of Patent: Sep. 5, 2017

(54) ELECTRICAL SWITCH ASSEMBLY

(71) Applicant: Defond Components Limited, Chai Wan, Hong Kong (CN)

(72) Inventor: Chiu Keung Loong, Hong Kong (CN)

(73) Assignee: Defond Components Limited, Chai Wan, Hong Kong (CN)

( * ) Notice: Subject to any disclaimer, the term of this patent is extended or adjusted under 35 U.S.C. 154(b) by 0 days.

(21) Appl. No.: 14/619,167

(22) Filed: Feb. 11, 2015

(65) Prior Publication Data

US 2015/0237744 A1   Aug. 20, 2015

(30) Foreign Application Priority Data

Feb. 18, 2014  (EP) .................................. 14155593

(51) Int. Cl.
| | | |
|---|---|---|
| H05K 5/00 | (2006.01) | |
| H01H 9/52 | (2006.01) | |
| H01H 1/58 | (2006.01) | |
| H05K 7/20 | (2006.01) | |

(52) U.S. Cl.
CPC ......... H05K 5/0052 (2013.01); H01H 1/5805 (2013.01); H01H 9/52 (2013.01); H05K 7/2039 (2013.01)

(58) Field of Classification Search
None
See application file for complete search history.

(56) References Cited

U.S. PATENT DOCUMENTS

| | | | | | |
|---|---|---|---|---|---|
| 4,563,592 | A | * | 1/1986 | Yuhasz | H05B 39/086 307/115 |
| 4,734,629 | A | * | 3/1988 | Lessig, III | H01H 9/061 200/568 |
| 4,995,094 | A | * | 2/1991 | Aio | H01H 9/041 318/545 |
| 5,200,657 | A | | 4/1993 | Prestel | |
| 6,535,409 | B2 | * | 3/2003 | Karol | H05K 7/209 361/688 |
| 7,638,725 | B2 | * | 12/2009 | Aoki | H01H 9/063 200/332.2 |
| 7,756,556 | B2 | * | 7/2010 | Patel | H01H 23/025 343/700 R |

(Continued)

OTHER PUBLICATIONS

European Patent Office; Search Report in European Patent Application No. 14 15 5593 (Jul. 14, 2014).

(Continued)

*Primary Examiner* — Courtney Smith
*Assistant Examiner* — Zhengfu Feng
(74) *Attorney, Agent, or Firm* — Leydig Voit and Mayer (57) ABSTRACT

An electrical switch assembly for an electrical appliance having an electrical load such as a motor, includes a housing with an opening, switch terminals, and an on/off mechanical switching module. The switch assembly includes an electronic control module operable with a semiconductor switching device to control operation of the load, and a heat sink in thermal contact with the switching device for dissipating heat. The heat sink is electrically conductive and is in electrical circuit connection with a first terminal of the switching device and one of the switch terminals. The heat sink closes the opening and forms part of the housing.

22 Claims, 4 Drawing Sheets

(56) References Cited

U.S. PATENT DOCUMENTS

| | | | |
|---|---|---|---|
| 8,071,903 B2* | 12/2011 | Sato | H01H 9/04 |
| | | | 200/522 |
| 2004/0134766 A1 | 7/2004 | Ching | |
| 2004/0251119 A1* | 12/2004 | Yahagi | H01H 9/061 |
| | | | 200/330 |
| 2006/0186102 A1* | 8/2006 | Inagaki | H01H 9/04 |
| | | | 219/130.21 |
| 2011/0109297 A1* | 5/2011 | Tosuntikool | H02M 5/257 |
| | | | 323/350 |
| 2014/0217920 A1* | 8/2014 | Bhosale | H03K 17/725 |
| | | | 315/268 |

OTHER PUBLICATIONS

European Patent Office; Office Action in European Patent Application No. 14 15 5593 (Jul. 14, 2014).

* cited by examiner

ELECTRICAL SWITCH ASSEMBLY

The present invention relates to an electrical switch assembly for controlling the operation of an electrical appliance.

BACKGROUND OF THE INVENTION

Electrical appliances including power tools, which are driven by an electric motor and often include a electronic control module for controlling the operation of the motor in addition to an electrical on-off switch, require a relatively larger interior space for accommodating the electronic control module. It is a challenge in terms of product design when there is only limited space to fulfill the needs for a compact electrical appliance or slim handheld power tool. Furthermore, the connection of wires between the electronic control module and the on-off switch, especially under confinement of space, is labour intensive as well as time consuming and inevitably increases the manufacturing cost.

It is often difficult to find extra space internally of an electrical appliance such as a power tool of a slim design with a mechanical on-off switch to accommodate an additional electronic control module to introduce new or valued-added features for product upgrade.

The invention seeks to mitigate or at least alleviate such problems or shortcomings by providing a new or otherwise improved electrical switch assembly that includes control features and yet remains compact in size.

SUMMARY OF THE INVENTION

According to the invention, there is provided an electrical switch assembly for an electrical appliance including an electrical load, comprising a housing has an external wall which has an opening, a plurality of switch terminals comprising two input terminals for connection to a power source and two output terminals for connection to a said electrical load, and a switching module comprising at least one fixed contact and a moving contact supported in the housing for movement between a first (ON) position in contact with said at least one fixed contact to switch on a said electrical load for operation and a second (OFF) position out of contact with said at least one fixed contact to switch off a said electrical load. Included are an electronic control module operable with a semiconductor switching device to control the operation of a said electrical load, and a heat sink in thermal contact with the semiconductor switching device for dissipating heat of the semiconductor switching device. The heat sink is electrically conductive and is in electrical circuit connection with a first terminal of the semiconductor switching device and one of the switch terminals. The heat sink closes the opening of the wall and forms part of the housing.

Preferably, said one of the switch terminals is a said input terminal or output terminal.

Preferably, the first terminal of the semiconductor switching device is in electrical contact with the heat sink.

Preferably, the heat sink has an integral part that provides or acts as said one of the switch terminals.

Preferably, the semiconductor switching device is connected with its first terminal to the heat sink by means of one of soldering, welding and riveting means.

Preferably, the housing is substantially cuboidal and has a plurality of sides including an apertured side that has the opening, and the heat sink occupies a major part of the apertured side.

Preferably, the heat sink has at least a part which extends across and closes the opening of the wall.

More preferably, the wall having the opening is mounded upon the heat sink by way of an injection insert molding process.

More preferably, the heat sink and the wall have substantially the same thickness at their interface.

It is preferred that the housing comprises at least two distinct first and second housing parts, and the heat sink is mechanically engaged or integrated with the second housing part that has the opening, together forming a one-piece structure.

It is preferred that the housing comprises at least two distinct first and second housing parts, with the first housing part holding the switching module and the second housing part having the opening and holding the heat sink and the electronic control module.

It is further preferred that the housing includes a partition between the first and second housing parts.

It is yet further preferred that the partition constitutes a distinct third housing part and has opposite first and second sides connected with the first and second housing parts respectively.

It is yet further preferred that the first side of the partition includes latching members in engagement with co-operable latching members provided on the first housing part, together forming an enclosure for the switching module.

It is yet further preferred that the second side of the partition includes latching members in engagement with co-operable latching members provided on the second housing part, for subsequently connecting the second housing part to the enclosure.

Conveniently, the electronic control module is provided on a circuit board.

In a preferred embodiment, the electronic control module is provided on a circuit board, and the circuit board is located in the second housing part on one side of the semiconductor switching device opposite the heat sink.

More preferably, the circuit board includes a plurality of electrical connectors for connecting the electronic control module with the switching module upon engagement of the second housing part directly or indirectly with the first housing part during assembly of the housing.

Further more preferably, the electrical connectors comprise one of springs and elastic members.

It is preferred that the electronic control module includes a capacitor connected across the input terminals when the switching module is closed with the moving contact in the first (ON) position, and the housing includes a holder holding the capacitor.

It is further preferred that the holder has a cavity beside the housing.

It is yet further preferred that the holder comprises a pocket.

Preferably, the semiconductor switching device is one of TRIAC and IGBT for an AC power source or a MOSFET for a DC power source.

BRIEF DESCRIPTION OF DRAWINGS

The invention will now be more particularly described, by way of example only, with reference to the accompanying drawings, in which.

DETAILED DESCRIPTION OF PREFERRED EMBODIMENT

Figure 1:
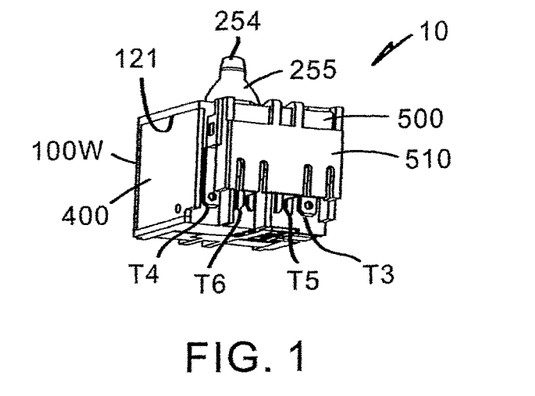
FIG. 1 is a front view of an embodiment of an electrical switch assembly in accordance with the invention.
Figure 2:
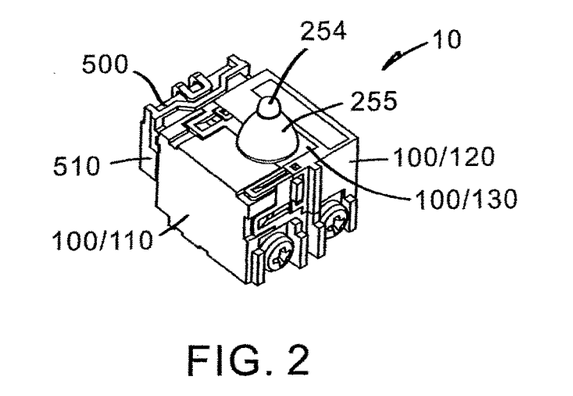
FIG. 2 is a rear perspective view of the electrical switch assembly of FIG. 1.
Figure 3:
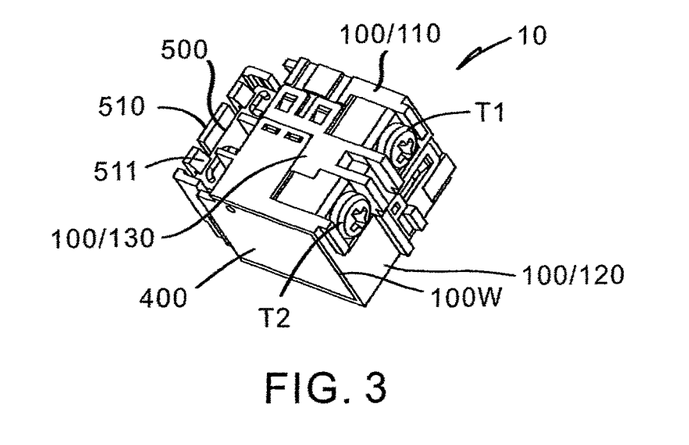
FIG. 3 is a bottom perspective view of the electrical switch assembly of FIG. 1.

Referring to the drawings, there is shown an electrical switch assembly 10, embodying the invention, for an electrical appliance such as an electrical power hand tool that includes an electrical load i.e. electric motor 20. The electrical switch assembly 10 has a housing 100 and a plurality of switch terminals which consist of two input terminals T1 and T2 for connection to an AC power source 30 and two output terminals T3 and T4 for connection to the electric motor 20. The housing 100 is substantially cuboidal or box-like, having six generally rectangular sides i.e. front, rear, left, right, top and bottom sides (FIGS. 1 and 2). The input and output terminals T1/T2 and T3/T4 are located on opposite rear and front sides of the housing 100.

The electrical switch assembly 10 includes a switching module 200 for mechanically connecting and disconnecting the electric motor 20 with respect to the power source 30, an electronic control module 300 operable with a semiconductor switching device, which is a TRIAC 350, to control the operation of the electric motor 20, and a heat sink 400 in thermal contact with the TRIAC 350 for dissipating the heat of the TRIAC 350 during operation.

The housing 100 has at least two first (right) and second (left) housing parts 110 and 120 and includes a third (middle) housing part 130, all of which are distinct or separate parts and are connected or assembled together to form the housing 100. The third housing part 130 acts as a partition 130 having opposite first (right) and second (left) sides 131 and 132 in engagement with the first and second housing parts 110 and 120 respectively, with the partition 130 being connected or sandwiched between the first and second housing parts 110 and 120. The partition 130 divides the housing 100 into two compartments.

In general, the switching module 200 is held by or in the first housing part 110, which is primarily the first compartment. And the electronic control module 300 with the heat sink 400 are held by or in the second housing part 120, which is primarily the second compartment.

The partition's first side 131 includes latching members in the form of loops 131L in engagement with co-operable latching members which are hooks 110L provided on the first housing part 110, whereby the two housing parts 110 and 130 are assembled together and form an enclosure 200E for the switching module 200. Being housed in the enclosure 200E and with the terminals T1 and T3 located on opposite sides thereof, the switching module 200 is or may be handled as an independent mechanical switch in its own right.

The partition's second side 132 includes latching members provided by hooks 132L in engagement with co-operable latching members in the form of loops 120L provided on the second housing part 120, for subsequent connection of the second housing part 120 to the enclosure 200E. The housing 100 is then completed, with the electronic control module 300 coupled to the mechanical switching module 200 for implementing more sophisticated electronic control.

The electronic control module 300 can easily be replaced in case of malfunctioning (e.g. failing quality check) or for upgrade purposes. This flexibility is particularly advantageous to manufactory.

The switching module 200 is composed of at least one fixed contact 210 and a moving contact 220 supported in the housing 100 for movement between a first (ON) position in contact with the fixed contact 210 to switch on the electric motor 20 for operation by connecting it to the power source 30 and a second (OFF) position out of contact with the fixed contact 210 to switch off the electric motor 20 by disconnecting it from the power source 30.

The fixed contact 210 extends horizontally, having an upturned front end fitted with a contact stud 211 and an upturned rear end which acts as the input terminal T1, provided with a screw 212 for connecting a cable from the power source 30. The moving contact 220 is a contact lever 220 fitted with a contact stud 221, and is pivoted upon the upper end of an inverted J-shaped fixed support strip 230 for pivotal movement between the first (ON) position, to make contact with the fixed contact 210 via their studs 221 and 211, and the second (OFF) position to break contact.

The support strip 230 is made of copper or copper alloy or, in general, an electrically-conducting material. Its lower end is bifurcated to form the output terminal T3, which provides electrical connection to the contact lever 220, and an extra terminal T5 for connection of a capacitor 500.

The switching module 200 incorporates an operating member 250 for, upon upward and downward movement, pivoting the contact lever 220. The operating member 250 has a bullet 251 which, under the action of a horizontal spring 252, bears against the contact lever 220 for flipping the contact lever 220 across opposite sides of the fulcrum i.e. the upper end of the conducting strip 230. The operating member 250 is biased upward by a vertical spring 253 below it, and includes an upstanding shaft 254 for depression to close the switching module 200, which is normally open. The shaft 254 is protected at its upper end by a rubber cap 255, which is sealed with an upper hole of the enclosure 200E, against ingress of dust.

The housing 100 has an external wall 100W on the left side (see in particular FIGS. 1 and 2), which has an opening 121 or is an apertured side. More specifically, the second housing part 120 is apertured, having a rectangular hole which is the opening 121 and it occupies almost the entire principal side of the second housing part 120 other than its four edges. There is also a second, smaller and oblong, opening 122 in the upper side of the second housing part 120, adjacent the larger opening 121.

As to the heat sink 400, it is generally rectangular and closes the opening 121, as well as the other opening 122, of the wall 100W and forms part of the housing 100. In terms of construction, the heat sink 400 is made from a copper plate shown in a vertical position, which is folded along its upper edge through 90° downwards to form a main panel 410 with a horizontal narrow flange 420 having an extended projecting free end which is folded through 90° downward to form a depending tab 430 alongside the main panel 410. The panel 410, flange 420 and tab 430 are all integral parts of the heat sink 400.

The wall 100W and, indeed, the second housing part 120, as a whole bearing the opening 121 is mounted upon the heat sink 400 by way of an injection insert (or over) molding process. During this process, thermoplastic material is molded around the heat sink 400 which has been pre-placed in the plastic injection molding cavity, resulting in a single strongly bonded, integrated structure, with the heat sink 400 completely surrounded along its perimeter other than the tab 420.

In the molded structure, the heat sink 400 has its main panel 410 extending across and closing to seal off the opening 121 of the wall 100W and its flange 420 likewise sealing off the other opening 122. The heat sink 400 and the wall 100W have substantially the same thickness at or along their interface. The heat sink 400 is mechanically engaged or integrated with the second housing part 120 that has the opening 121, together forming a one-piece structure.

The flange 420 is formed for two reasons: it gives the overall heat sink 400 an L-shaped or angle cross-section, and in general a non-planar cross-section, for rigid integration with the second housing part 120, and it also provides a foundation for the tab 430. The tab 430, being an integral part of the heat sink 400, provides or acts as the other output terminal T4.

The heat sink 400 is made from a thermally conductive as well as electrically conductive material, such as copper or copper alloy. As the opening 121 occupies almost the entire principal side of the second housing part 120 (i.e. the housing wall 100W) within its four edges, the heat sink 400 in the opening 121 occupies a major part of the apertured side. With this design, the area of the heat sink 400 that is exposed to the exterior, i.e. the main panel 410, is largest position to maximize the efficiency of heat dissipation.

The TRIAC 350 is a bidirectional triode thyristor or bilateral triode thyristor which, under the control of the electronic control module 300, provide an additional current switching means for the electric load/motor 20. It has a pair of terminals A1 and A2 and a gate electrode G, and the (first) terminal A2 is in the form of a large contact layer over the back of the TRIAC 350. The TRIAC 350 is attached with its back, i.e. the terminal A2, on and lying against the main panel 410 of the heat sink 400, on the inner side of the heat sink 400 internally of the second housing part 120. The terminal A2 is therefore in electrical contact with the heat sink 400. For secure attachment, the TRIAC 350 is connected, with its terminal A2, to the heat sink 400 by means of one of soldering, welding and riveting means.

Based on the foregoing, the heat sink 400 is in electrical circuit connection with the terminal A2 of the TRIAC 350 and also one of the switch terminals i.e. the output terminal T4.

Figure 7:
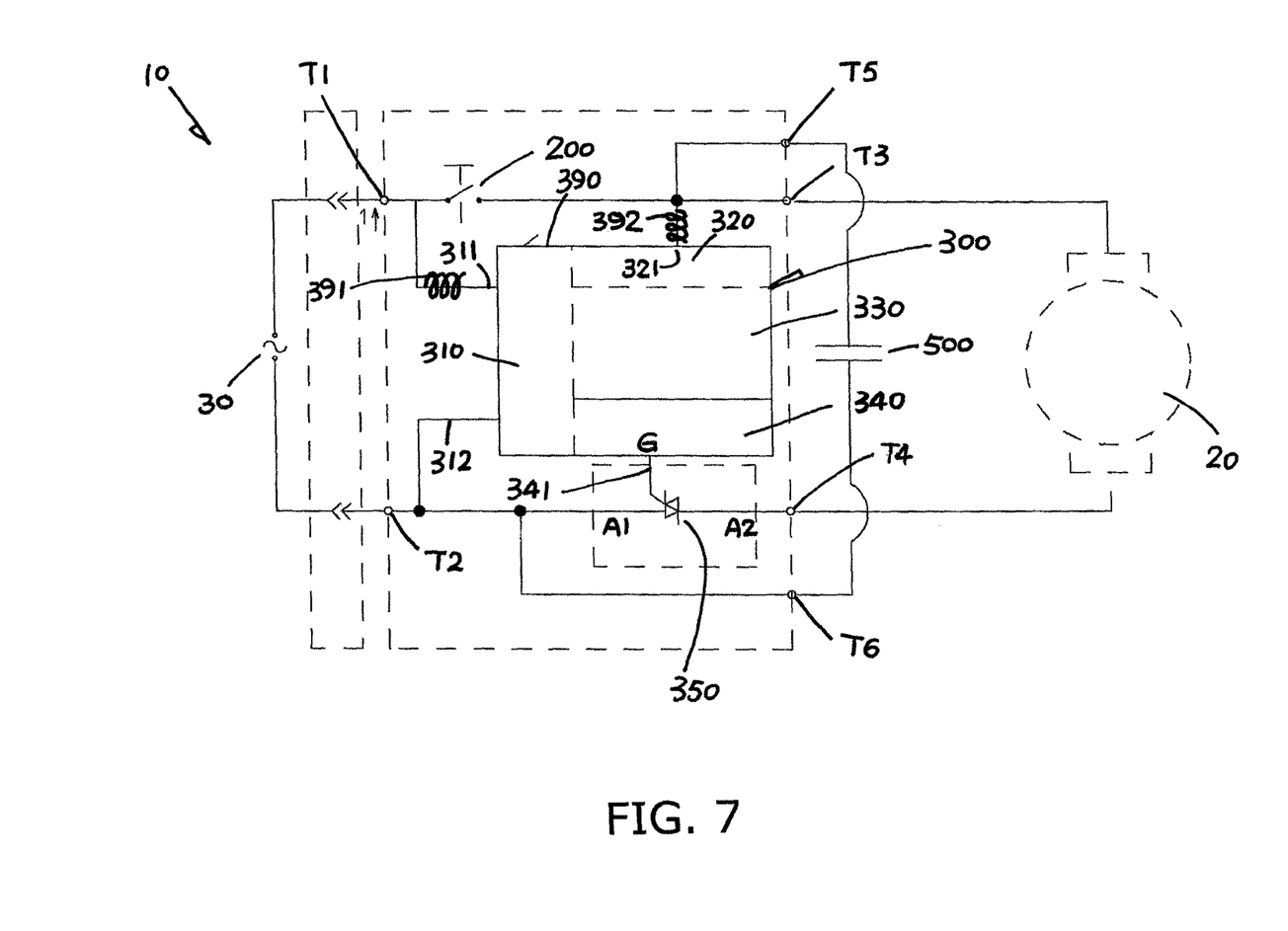
FIG. 7 is a schematic circuit diagram of the electrical switch assembly of FIG. 4.

It is envisaged that being a bi-directional device the TRIAC 350 may be connected in the reverse direction in the electronic control module 300 compared to the connection shown in FIG. 7, such that its terminal A2 and hence the heat sink 400 in contact therewith are connected to the input terminal T2 rather than the output terminal T4.

Inside the second housing part 120, there is also located a three-part fixed conducting strip 450, which extends across the housing part 120 right next to the TRIAC 350 and is folded several times along its length to assume a general S-shape. One end of the conducting strip 450 acts as the input terminal T2, provided with a screw 452 for connecting the cable from the power source 30. The opposite end forms a second extra terminal T6 for connection of the capacitor 500. At about mid-length the conducting strip 450 provides a pin 451 for direct connection to the electronic control module 300.

Referring now to the electronic control module 300, it is made up of the following major functional circuits:

a supply control circuit 310 with two inputs 311 and 312 connected to the input terminals T1 and T2 respectively a switch-on detection circuit 320 with an input 321 connected to the fixed contact 210 for detecting closing of the switching module 200 a control unit 330 for disabling the power output in case the switching module 200 is in the closed position while connecting to the power source 30, with an optional soft-start function (i.e. an inrush current limiter) and additional control functions (e.g. intermittent or timed switch-on control, and interactive control with feedback)

solid-state control circuit 340 with an output 341 connected to the gate electrode G of the TRIAC 350 for controlling its operation, e.g. the phase angle at which to turn on the TRIAC 350

These functional circuits 301 to 340 will not be described in detail for clarity, as they are generally known in the art.

The electronic control module 300 is provided or mounted on a printed circuit board 390 which is located in the second housing part 120 on one side of the conducting strip 450 opposite the TRIAC 350. With the TRIAC 350 (attached to the heat sink 400) and the conducting strip 450 located inside the second housing part 120, the circuit board 390 extends just within and across an otherwise open inner side of the housing part 120 opposite the heat sink 400. With this arrangement, the circuit board 390 is exposed on the inner side of the second housing part 120 facing the partition 130.

Before the circuit board 390 is mounted, cables are used to connect the gate electrode G of the TRIAC 350 to the circuit board 390 and the terminal A1 to the conducting strip 450. The conducting strip's pin 451 is then soldered to the circuit board 390 for mechanically locating the same and electrically connecting to one input 312 of the supply control circuit 310 of the electronic control module 300.

There are at least two electrical connections required for coupling the electronic control module 300 to the mechanical switching assembly 200 and, more specifically, to its fixed and moving contacts 210 and 220. Such connections are to be carried out by a pair of electrical connectors in the form of two coil springs 391 and 392 which are soldered on the circuit board 390 and to the electronic control module 300.

For coupling, the circuit board 390 includes the two springs 391 and 392 for self connecting the electronic control module 300 to the switching module 200 upon engagement of the second housing part 120 (indirectly via the partition 130) with the first housing part 110 during assembly of the housing 100.

In the circuitry of the control module 300 shown in FIG. 7, the first spring 391 is connected to or provided at one input 311 of the supply control circuit 310 and the second spring 392 to or at the input 321 of the switch-on detect circuit 320. Both springs 391 and 392 are soldered on the circuit board 390 at the appropriate positions, projecting at right angles therefrom.

Parts of the fixed contact 210 and the support strip 230, which is in engagement with the moving contact 220, are exposed via respective small holes through the partition 130, at positions that are aligned with the springs 392 and 391 respectively. Thus, upon engagement of the second housing part 120 via the partition 130 with the first housing part 110 during assembly of the housing 100, the electronic control module 300 is self-connected to the switching module 200 through physical contact of the springs 392 and 391 with the exposed parts of the fixed and moving contacts 210 and 220 respectively.

Such a design of mechanical/electrical connection does not only enable convenient coupling of the electronic control module 300 to the switching module 200, but also convenient decoupling of the two modules 200 and 300 if necessary e.g. for replacement during production phase or repair afterward.

To help reducing emission and increasing the immunity of radio interference, the electronic control module 300 includes a capacitor 500 for use across the power source 30, which is an EMI i.e. electromagnetic interference suppression film capacitor. The capacitor 500 is connected across the input terminals T1 and T2 and the switching module 200, such that when the switching module 200 is closed [i.e. with the moving contact 220 in the first (ON) position], the capacitor 500 is connected across the power source 30 to filter off undesirable noises that otherwise lead to emission and radio interference.

Figure 4:
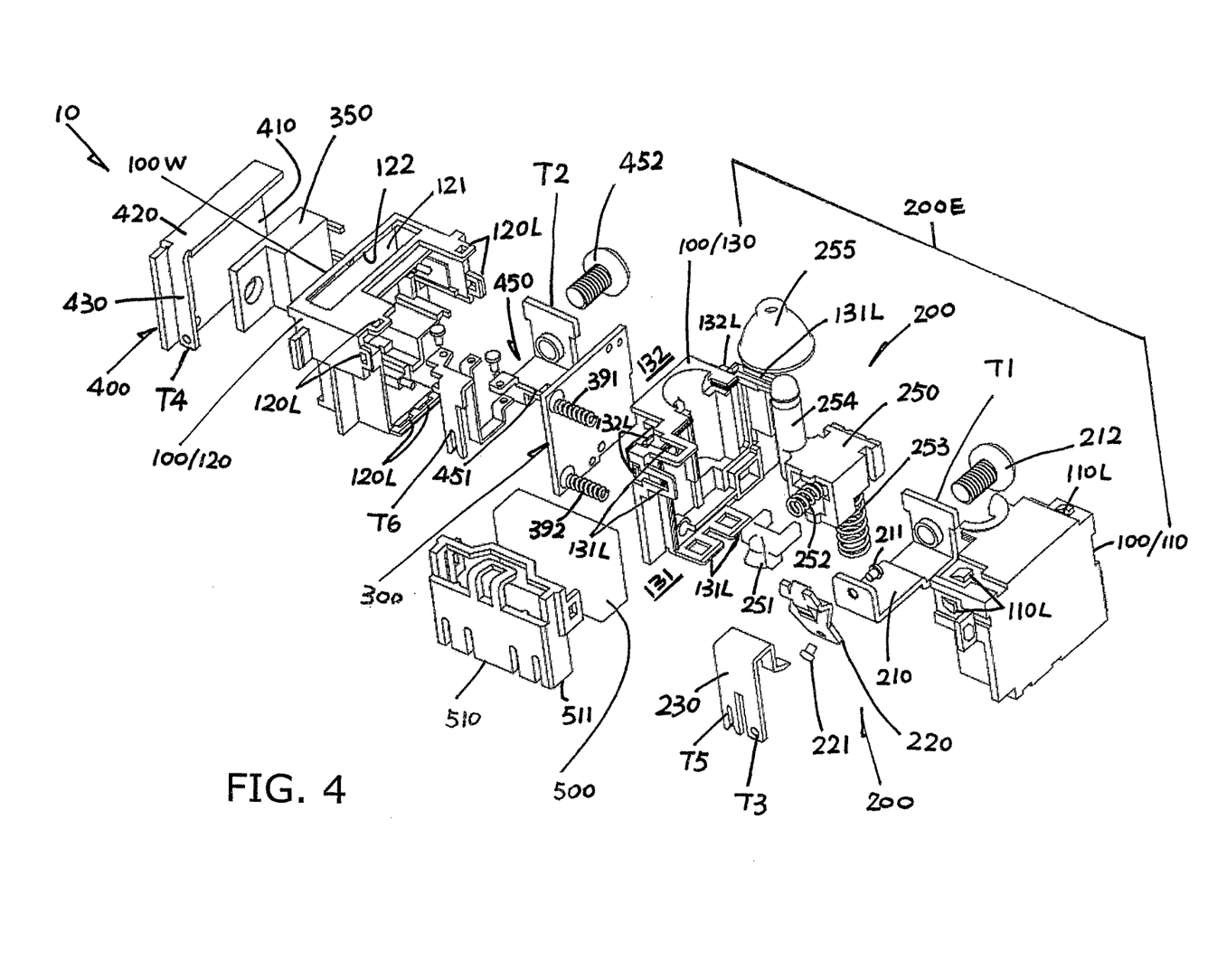
FIG. 4 is an exploded front perspective view of the electrical switch assembly of FIG. 1, showing most of its parts and components.
Figure 5:
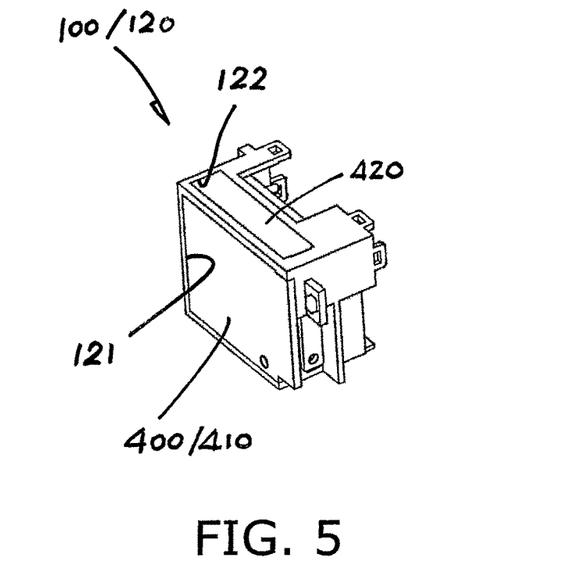
FIG. 5 is a perspective view of a left side part of the electrical switch assembly of FIG. 4.
Figure 6:
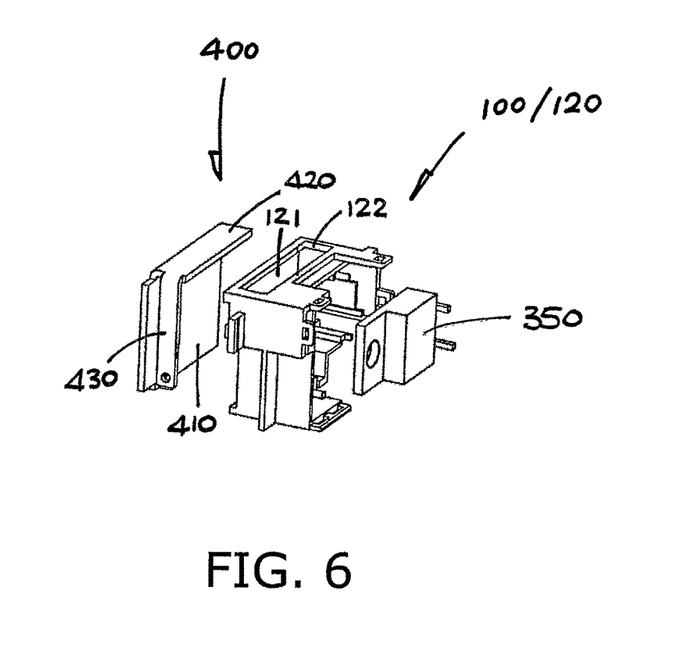
FIG. 6 is an exploded perspective view corresponding to FIG. 5, showing a heat sink, a left housing part and a semiconductor switching device.

The capacitor 500 is usually bulky and rectangular in shape. The housing 100 preferably includes a holder 510 holding the capacitor 500. The holder 510 is a plastic cover snapped fitted upon the front side of the housing 100 (see in particular FIGS. 1 and 4), having a cavity beside the housing 100 with an open lower end 511 in the form of a side pocket.

The electrical switch assembly 10 according to the subject invention is compact in size and dimensions, generally within 50 mm×50 mm×50 mm, taking into account of the fact that it includes the electronic control module 300.

Depending on the performance requirements, although the semiconductor switching device (350) is implemented by a TRIAC, it may alternatively be an IGBT transistor (i.e. insulated-gate bipolar transistor) also for the AC power source 30 or a MOSFET transistor (i.e. metal-oxide-semiconductor field-effect transistor) for a DC power source. In general, in place of the analog discrete components used as described above, the electronic control module (300) may incorporate digital control such as MCU or ASIC for controlling the operation of the semiconductor switching device (350).

It is envisaged that the electrical load to be controlled by the electrical switch assembly 10 may be a resistive load (e.g. a heater) rather than an inductive load i.e. electric motor 20 as described above. The input and output terminals T1 to T6 may in part be implemented by tabs for quick connect or employ screw or soldering connection, or the like. An optional recoil spring may be installed in the switching module 200 or contact system assembly to provide return force on release of the actuating shaft 254.

It is also envisaged that any of the terminals T1 to T6 may comprise or be pre-connected with wires or cables to facilitate connection. The electronic control module 300 may be provided or mounted on a circuit board of any other suitable types, such as non-printed board, ceramic, copper substrate or aluminum substrate board. The springs 391 and 392, which are made of copper in the described embodiment, may be replaced by elastic conducting means or members such as conductive rubber strips.

In general, the subject invention relates to an electrical switch assembly having integrated control electronics including a semiconductor switching device, of outer dimensions compatible with that of the existing mechanical switches. The electrical switch assembly is compact in size and incorporates equivalent input/output terminals as the existing switches helps to meet challenges on new market needs. Mechanical redesign or upgrading of electrical appliances or handheld power tools to include new features can be avoided or at least made easy.

The invention has been given by way of example only, and various other modifications of and/or alterations to the described embodiment may be made by persons skilled in the art without departing from the scope of the invention.

The invention claimed is:

1. An electrical switch assembly for an electrical appliance including an electrical load, comprising:
   a housing that is substantially cuboidal and has a plurality of sides and external walls, including a first external wall having an aperture occupying almost all of the side of the housing that includes the first external wall;
   a plurality of switch terminals comprising two input terminals for connection to a power source and two output terminals for connection to the electrical load;
   a mechanical switching module located within the housing, in a first housing part of the housing, and comprising at least one fixed contact and a moving contact supported in the housing for movement between a first position in contact with the at least one fixed contact, to electrically connect the electrical load for operation, and a second position, out of contact with the at least one fixed contact, to electrically disconnect the electrical load;
   an electronic control module located within the housing, in a second housing part of the housing, and comprising a semiconductor switching device to control the operation of the electrical load; and
   a heat sink located within the housing, in the second housing part of the housing, in thermal contact with the semiconductor switching device for dissipating heat from the semiconductor switching device, wherein
   the heat sink is electrically conductive and is electrically connected to a first terminal of the semiconductor switching device and one of the switch terminals of the plurality of switch terminals, and
   the heat sink closes and is exposed by the aperture in the first external wall and is thereby a major part of a side of the housing.

2. The electrical switch assembly as claimed in claim 1, wherein the heat sink is mechanically engaged with the second housing part that includes the first external wall having the aperture.

3. The electrical switch assembly as claimed in claim 1, wherein the housing includes a partition between the first and second housing parts.

4. The electrical switch assembly as claimed in claim 3, wherein the partition opposite first and second sides respectively mechanically connected to the first and second housing parts.

5. The electrical switch assembly as claimed in claim 4, wherein
   the first housing part includes latching members,
   the first side of the partition includes latching members in engagement with the latching members of the first housing part, and
   the partition and the first housing part, together, enclose the mechanical switching module.

6. The electrical switch assembly as claimed in claim 5, wherein
   the second housing part includes latching members,
   the second side of the partition includes latching members in engagement with the latching members of the second housing part, and
   the partition and the second housing part, together, enclose the electronic control module.

7. The electrical switch assembly as claimed in claim 1 including a circuit board, wherein the electronic control module is located on the circuit board.

8. The electrical switch assembly as claimed in claim 1, wherein
the electronic control module includes a circuit board,
the circuit board is located in the second housing part, and
the semiconductor switching device is located between the circuit board and the heat sink.

9. The electrical switch assembly as claimed in claim 8, wherein the circuit board includes a plurality of electrical connectors electrically connecting the electronic control module to the mechanical switching module.

10. The electrical switch assembly as claimed in claim 9, wherein the electrical connectors are selected from the group consisting of springs and elastic members.

11. The electrical switch assembly as claimed in claim 1, including:
a capacitor electrically connected across the input terminals when the moving contact is in the first position, and
a holder holding the capacitor and attached to the first housing part of the housing.

12. The electrical switch assembly as claimed in claim 11, wherein the holder has a cavity adjacent the housing and in which the capacitor is located, and an open end defining a pocket.

13. The electrical switch assembly as claimed in claim 1, wherein the semiconductor switching device is selected from the group consisting of a TRIAC and an IGBT for switching an AC power source, and a MOSFET for switching a DC power source.

14. An electrical switch assembly for an electrical appliance including an electrical load, comprising:
a housing including a first housing part, a second housing part, and a partition interposed between the first and second housing parts, wherein
the partition has opposed first and second sides respectively facing and including latching members,
the first housing part includes latching members engaging the latching members on the first side of the partition, and the partition and the first housing part, together, define a first compartment of the housing, and
the second housing part includes latching members engaging the latching members on the second side of the partition, and the partition and the second housing part, together, define a second compartment of the housing;
a plurality of switch terminals comprising two input terminals for connection to a power source and two output terminals for connection to the electrical load;
a mechanical switching module located within the first compartment of the housing and comprising at least one fixed contact and a moving contact supported in the housing for movement between a first position in contact with the at least one fixed contact, to electrically connect the electrical load for operation, and a second position, out of contact with the at least one fixed contact, to electrically disconnect the electrical load;
an electronic control module located within the second compartment of the housing and comprising a semiconductor switching device to control the operation of the electrical load; and
a heat sink located within the second compartment of the housing and in thermal contact with the semiconductor switching device for dissipating heat from the semiconductor switching device, wherein the heat sink is electrically conductive and is electrically connected to a first terminal of the semiconductor switching device and one of the switch terminals of the plurality of switch terminals.

15. The electrical switch assembly as claimed in claim 14, wherein the second housing part includes an external wall having an aperture and the heat sink closes and is exposed by the aperture.

16. The electrical switch assembly as claimed in claim 15, wherein the heat sink is mechanically engaged with the external wall.

17. The electrical switch assembly as claimed in claim 14, wherein
the electronic control module includes a circuit board,
the circuit board is located in the second compartment, and
the semiconductor switching device is located between the circuit board and the heat sink.

18. The electrical switch assembly as claimed in claim 17, wherein the circuit board includes a plurality of electrical connectors electrically connecting the electronic control module to the mechanical switching module.

19. The electrical switch assembly as claimed in claim 18, wherein the electrical connectors are selected from the group consisting of springs and elastic members.

20. The electrical switch assembly as claimed in claim 14, including:
a capacitor electrically connected across the input terminals when the moving contact is in the first position, and
a holder holding the capacitor and attached to the first housing part of the housing.

21. The electrical switch assembly as claimed in claim 20, wherein the holder has a cavity adjacent the housing and in which the capacitor is located, and an open end defining a pocket.

22. The electrical switch assembly as claimed in claim 14, wherein the semiconductor switching device is selected from the group consisting of a TRIAC and an IGBT for switching an AC power source, and a MOSFET for switching a DC power source.

* * * * *